US012796146B2

(12) United States Patent
Borthakur et al.

(10) Patent No.: US 12,796,146 B2
(45) Date of Patent: Nov. 10, 2026

(54) CHIP STACKING WITH BOND PAD ABOVE A BONDLINE

(71) Applicant: SEMICONDUCTOR COMPONENTS INDUSTRIES, LLC, Scottsdale, AZ (US)

(72) Inventors: Swarnal Borthakur, Boise, ID (US); Marc Allen Sulfridge, Boise, ID (US); Jeffrey Peter Gambino, Gresham, OR (US); Vladimir Korobov, San Mateo, CA (US); Richard Mauritzson, Meridian, ID (US); David T. Price, Gresham, OR (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 630 days.

(21) Appl. No.: 18/309,933

(22) Filed: May 1, 2023

(65) Prior Publication Data

US 2024/0371905 A1 Nov. 7, 2024

(51) Int. Cl.

*H10F 39/00* (2025.01)
*H10W 42/00* (2026.01)
*H10W 90/00* (2026.01)

(52) U.S. Cl.

CPC ......... *H10F 39/809* (2025.01); *H10F 39/018* (2025.01); *H10F 39/8053* (2025.01); *H10F 39/8063* (2025.01); *H10F 39/811* (2025.01); *H10W 42/00* (2026.01); *H10W 90/00* (2026.01)

(58) Field of Classification Search

CPC .. H10F 39/809; H10F 39/018; H10F 39/8053; H10F 39/8063; H10F 39/811; H10F 39/026; H10W 42/00; H10W 90/00

See application file for complete search history.

(56) References Cited

U.S. PATENT DOCUMENTS

| | | | | |
|---|---|---|---|---|
| 10,529,752 | B2 * | 1/2020 | Ishiwata | H10F 39/018 |
| 12,396,274 | B2 * | 8/2025 | Iwata | G01S 7/4865 |
| 2006/0289974 | A1 * | 12/2006 | Saran | H01L 24/05 257/669 |
| 2011/0102657 | A1 * | 5/2011 | Takahashi | H01L 24/05 257/E27.122 |
| 2013/0321680 | A1 * | 12/2013 | Kumano | H10F 39/8053 438/70 |

(Continued)

FOREIGN PATENT DOCUMENTS

| | | | |
|---|---|---|---|
| DE | 102015110731 | A1 | 12/2016 |
| DE | 102019117352 | A1 | 4/2020 |

*Primary Examiner* — Dao H Nguyen

(74) *Attorney, Agent, or Firm* — Brake Hughes Bellermann LLP

(57) ABSTRACT

A semiconductor device may include a first chip that includes a first wafer and a first dielectric layer disposed thereon. The semiconductor device may include a second chip that includes a second wafer and a second dielectric layer disposed thereon, the second chip having a backside surface and a frontside surface opposed to the backside surface, the second chip being bonded to the first chip at the frontside surface to define a bond line between the first dielectric layer and the second dielectric layer. An opening through the backside surface of the second chip may extend into the second dielectric layer, and a bond pad may be disposed within the second dielectric layer between the second wafer and the bond line.

17 Claims, 8 Drawing Sheets

(56) References Cited

U.S. PATENT DOCUMENTS

| | | | | |
|---|---|---|---|---|
| 2016/0379960 | A1* | 12/2016 | Huang .................. | H10F 39/809 |
| 2023/0361139 | A1 | 11/2023 | Borthakur et al. | |
| 2024/0105644 | A1* | 3/2024 | Yeh ......................... | H01L 25/50 |

* cited by examiner

CHIP STACKING WITH BOND PAD ABOVE A BONDLINE

TECHNICAL FIELD

This description relates to chip stacking.

BACKGROUND

Examples of chip stacks include structures in which one chip (also referred to as a top chip, or a second chip) is flipped and bonded to another chip (also referred to as a bottom chip, or a first chip). Put another way, a frontside of the top chip may be bonded to a frontside of the bottom chip, so that a backside of the top chip and the backside of the bottom chip are available for electrical connections and other functions.

For example, when the top chip is an optical sensor chip, optical sensing elements may be disposed close to the backside of the top chip, so that light that is incident on the exposed backside of the top chip may easily reach optical sensing elements (e.g., without traversing intervening circuit elements). More generally, such chip stacking techniques make it possible to form reliable, low-latency connections between circuits/devices of the stacked chips.

Various techniques may be used to connect circuits/devices of chip stacks to external circuits. For example, chip stack circuits/devices may be connected to a redistribution layer (RDL), which may be connected to a solder bump that is accessible for connections to external circuits. In other examples, an etching process may be executed to remove a portion of the backside of the top chip and thereby form an opening therein. Then, a wire bond, solder bump, or other external connection may be established with a bond pad that is within, or accessible via, the opening.

SUMMARY

According to one general aspect, a semiconductor device includes a first chip that includes a first wafer and a first dielectric layer disposed thereon, and a second chip that includes a second wafer and a second dielectric layer disposed thereon, the second chip having a backside surface and a frontside surface opposed to the backside surface, the second chip being bonded to the first chip at the frontside surface to define a bond line between the first dielectric layer and the second dielectric layer. The semiconductor device includes an opening through the backside surface of the second chip that extends into the second dielectric layer, and a bond pad disposed within the second dielectric layer between the second wafer and the bond line, and extending beyond the opening in a direction parallel to the bond line.

According to another general aspect, a semiconductor device includes a first chip that includes a first wafer and a first dielectric layer disposed thereon, and a second chip that includes a second wafer and a second dielectric layer disposed thereon, with a bond pad disposed within the second dielectric layer, the second chip having a backside surface and a frontside surface opposed to the backside surface and being bonded to the first chip at the frontside surface to define a bond line between the first dielectric layer and the second dielectric layer. The semiconductor device also includes an opening through the backside surface of the second chip and through the second wafer, the opening extending into the second dielectric layer to expose only a portion of an upper surface of the bond pad for electrical connection thereto.

According to another general aspect, a method of making a semiconductor device includes forming a first chip that includes a first wafer and a first dielectric layer disposed thereon, forming a second dielectric layer on a second wafer of a second chip, and forming a bond pad within the second dielectric layer. The method further includes bonding a frontside surface of the second chip to the first chip to define a bond line between the first dielectric layer and the second dielectric layer, and etching an opening through a backside surface of the second chip that extends through the second wafer and into the second dielectric layer to the bond pad, for electrical connection thereto.

The details of one or more implementations are set forth in the accompanying drawings and the description below. Other features will be apparent from the description and drawings, and from the claims.

DETAILED DESCRIPTION

Figure 1:
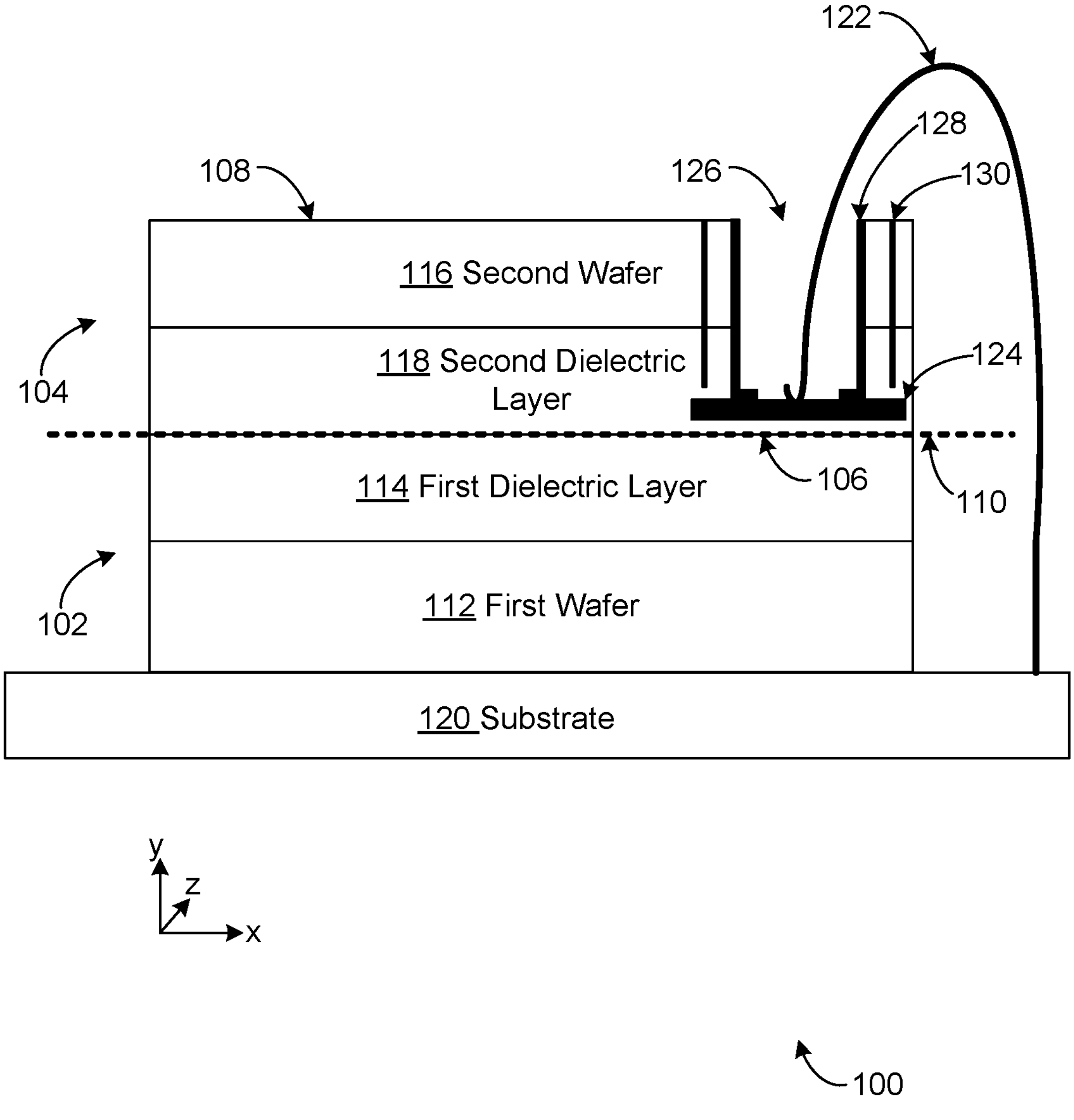
FIG. 1 is a block diagram of a chip stack with a bond pad above a bondline.

Conventional bond pads and associated wire bonds, solder bumps, or other external connections are associated with a number of difficulties in chip stacking scenarios. For example, such external connections may be unreliable and/or complex to manufacture.

In more specific examples, a conventional wire bond connected to a bond pad within an etched opening may be prone to short-circuit failures when the wire bond contacts a sidewall of the etched opening. Such conventional wire bonds may also be prone to disconnect from a corresponding bond pad. Attempts to secure the connection between the wire bond and the bond pad by exerting more force when establishing the connection may lead to damage (e.g., cracking) to the bond pad, particularly when the bond pad is relatively thin and/or small. Conventional bond pads, however, may be required to be thin and/or small, due to various other manufacturing constraints. Such thin bond pads may further suffer from being excessively consumed by intermetallic compounds (IMCs) during contact formation.

Moreover, in such scenarios, an etching process for establishing the etched opening may be prone to error and otherwise difficult to complete in a desired manner. For example, etching a relatively deep opening through a top chip to reach a bond pad within the bottom chip may result in undesired quantities of etching-related residues. If a quantity of photoresist is reduced, e.g., to reduce such residues, then a corresponding resist error margin will also typically be reduced. In other words, conventional techniques may require a precise amount of resist and associated etching in order to avoid inadvertently etching other chip components (e.g., filters or lenses, when the top chip is an optical sensor chip).

Further, conventional chip stacks may be susceptible to failure or malfunction resulting from moisture ingress into the chip stack. For example, as described in more detail, below, it is possible for moisture to diffuse into the chip stack and cause corrosion of bonds at a bond line at which the top chip is joined to the bottom chip.

In order to provide chip stacks with external connections that are reliable, and that may be manufactured easily and reliably, described techniques provide a bond pad within a top chip, with the bond pad extending beyond a width of an etched opening in the top chip through which the bond pad is reached to establish the external connection. Accordingly, as described in detail, below, the bond pad may be larger and/or thicker than conventional bond pads, and the etched opening may correspondingly be larger than conventional etched openings. Described approaches thereby reduce a risk of cracking of the bond pad, facilitate the joining of an external connection (e.g., wire bond) to the bond pad, and reduce a risk of short circuit of the external connection with respect to a sidewall of the etched opening.

Moreover, less etching is required to reach the bond pad in the top chip, as compared to a conventional bond pad in a bottom chip, so that etching residues are reduced, while the etching process is easier and has a larger margin for error. Further, by placing the bond pad above the bond line joining the top and bottom chips, while extending the bond pad beyond the etched opening, moisture ingress through the etched opening may be blocked from reaching the bond line and causing corrosion of the bond line bonds. Such moisture blocking may be further facilitated by including either a metal seal ring around the etched opening, and/or using dielectric materials with high moisture resistance.

FIG. 1 is a block diagram of a chip stack 100 with a bond pad 124 above a bond line 110. As referenced above, and illustrated in FIG. 1, the chip stack 100 includes a first chip 102, which may also be referred to as a primary chip or a bottom chip. The first chip 102 may represent, e.g., an ASIC chip, an image sensor processor (ISP) chip, or an integrated passive chip (IPC), more detailed examples of which are discussed below.

A second chip 104 may be disposed on the first chip 102. For example, the second chip 104 may include an optical sensor chip, including, e.g., and image sensor chip, such as a complementary metal oxide semiconductor (CMOS) chip.

As shown, a frontside surface 106 of the second chip 104 may be face-to-face with an upper surface of the first chip 102, while a backside surface 108 of the second chip 104 faces an upwards direction in FIG. 1, away from the first chip 102 and opposed to the frontside surface 106. Thus, the second chip 104 is above the first chip 102 in a y direction, and joined (e.g., bonded) to the first chip 102 along an x-z plane to define a bond line 110.

As further illustrated, the first chip 102 includes a first wafer 112 and a first dielectric layer 114. Similarly, the second chip 104 includes a second wafer 116 and a second dielectric layer 118. For example, the first wafer 112 and the second wafer 116 may be formed using Silicon (Si). The dielectric layers 114, 118 may each include multiple dielectric layers, as illustrated in various examples, below. For example, such dielectric layers may include various types of Silicon nitride (SiN) or Silicon dioxide ($SiO_2$).

The first chip 102 and the second chip 104 may have various types of circuits formed therein. Such circuits may be formed in or on any of the first wafer 112, first dielectric layer 114, second wafer 116, and/or second dielectric layer 118. For example, when the second chip 104 includes an image sensor chip, provided image sensors may include a pixel array used to produce color images by forming a color filter array (CFA) and associated microlenses over the pixel array. For example, complementary metal-oxide-semiconductor (CMOS) image sensors may include or utilize photodiodes, related circuitry, dielectric layers, and metal interconnects, all formed on a substrate to provide an image sensor chip. The second chip 104 may include any type of image sensor chip and the first chip may include any circuit chip configured to operate and/or receive an output of such an image sensor chip. Additional or alternative details and examples of these and related image sensor circuits are provided below, e.g., with respect to FIGS. 3, 4, and 7-10.

A substrate 120 provides support for the illustrated chip stack 100, with the first chip 102 being attached to the substrate 120 using, e.g., a suitable die attach film. In addition to providing mechanical support for the chip stack 100, the substrate 120 may be used to position various other circuit elements, and may thereby be configured to enable external electrical connections between the chip stack 100 and such various other circuit elements.

In the example of FIG. 1, such an external connection is represented by a wire bond 122, which is connected to a bond pad 124 via an etched opening 126. As shown, the opening 126 is formed through the backside surface 108 of the second chip 104, and extends to the bond pad 124. Although not shown in FIG. 1 for the sake of simplicity, the wire bond 122 may be used for any desired connection(s) with respect to the chip stack 100, including, e.g., probe and testing connections. Moreover, as also referenced herein, other types of external connections may be formed instead of the wire bond 122, such as a solder bump(s).

Further in FIG. 1, sidewall passivation layer 128 extends along a sidewall of the opening 126. In FIG. 1, the sidewall passivation layer 128 further extends over portions of the bond pad 124 in an x-z plane. In various other examples, the sidewall passivation layer 128 may extend to the bond pad 124 without extending further over the bond pad 124. In still other examples, the sidewall passivation layer 128 may not extend to the bond pad 124, e.g., may expose a portion of the second dielectric layer 118 between the sidewall passivation layer 128 and the bond pad 124.

A seal ring 130 extends around a perimeter of the opening 126. For example, the seal ring 130 may be formed using a suitable metal or other moisture resistant material, such as, e.g., Tungsten, polysilicon, or combinations thereof.

As referenced above, and described in more detail, below, the first chip 102 and the second chip 104 may be joined at the bond line 110. For example, they may be joined using, e.g., Copper-Copper (Cu—Cu) hybrid bonds. Moisture that reaches the bond line 110 may cause corrosion of such hybrid bonds, which may lead to reliability failures of the chip stack 100 as whole. For example, moisture ingress may occur via the opening 126, e.g., by diffusion through the passivation layer 128. In some implementations, such diffusion may be driven by high voltages, e.g., at the connection of the wire bond 122.

For example, although not shown in FIG. 1 for the sake of simplicity, the wire bond 122 may be covered with glass attach adhesive and/or encapsulation. Such adhesives and encapsulant materials are generally not hermetic, so that moisture may diffuse through them to reach the opening 126 and the sidewall passivation layer 128. For example, the chip stack 100 may be used in various automotive scenarios, where moisture may be present and reliability of the chip stack 100 may be critical.

In the chip stack 100, moisture may diffuse through glass attach adhesives and/or encapsulant materials, as well as through the sidewall passivation layer 128. In the chip stack 100, however, one or more moisture-protection techniques may be used to protect the bond line 110 from moisture ingress.

For example, as already described, the bond pad 124 is positioned above the bond line 110 in a y direction. The bond pad 124 may be formed using any suitable material for a corresponding external connection (e.g., the wire bond 122 of FIG. 1). For example, the bond pad 124 may be formed using Aluminum (Al), or may be formed using copper with nickel plating and an anti-oxidizing layer formed thereon. Such bond pad materials are highly moisture-resistant and prevent moisture reaching the opening 126 from reaching the bond line 110.

As noted above, the seal ring 130 may additionally or alternatively provide moisture resistance, i.e., a moisture barrier. In FIG. 1, the seal ring 130 surrounds the opening 126, and the bond pad 124 extends beyond the both the opening 126 and the seal ring 130 in an x-z plane that is parallel to the bond line 110. In other examples, however, some of which are provided below, the bond pad 124 may not extend under the seal ring 130, or may extend under only a portion of the seal ring 130. In some examples, the seal ring 130 may be partially or completely omitted, and/or may be formed from two separate rings/structures, as shown in the top view of FIG. 2. The seal ring 130 may be concentric with the opening 126, with any suitable distance between the opening 126 and the seal ring 130.

Additional or alternative moisture protection may be provided through the selection of suitably moisture-resistant materials within the second dielectric layer 118. That is, as noted above, the second dielectric layer 118 may include multiple dielectric materials, which may also be referred to, or include, multiple dielectric layers. Not shown separately in the simplified example of FIG. 1, but shown in more detail below, e.g., with respect to FIGS. 3, 4, and 7-10, one or more SiN layers may be included within the second dielectric layer 118. For example, such a SiN layer may be positioned to be coplanar with the bond pad 124. In some implementations, a SiN layer may have a surface that is coplanar with an upper surface of the bond pad 124. Accordingly, moisture diffusing through the passivation layer 128 may be prevented from reaching the bond line 110.

Figure 2:
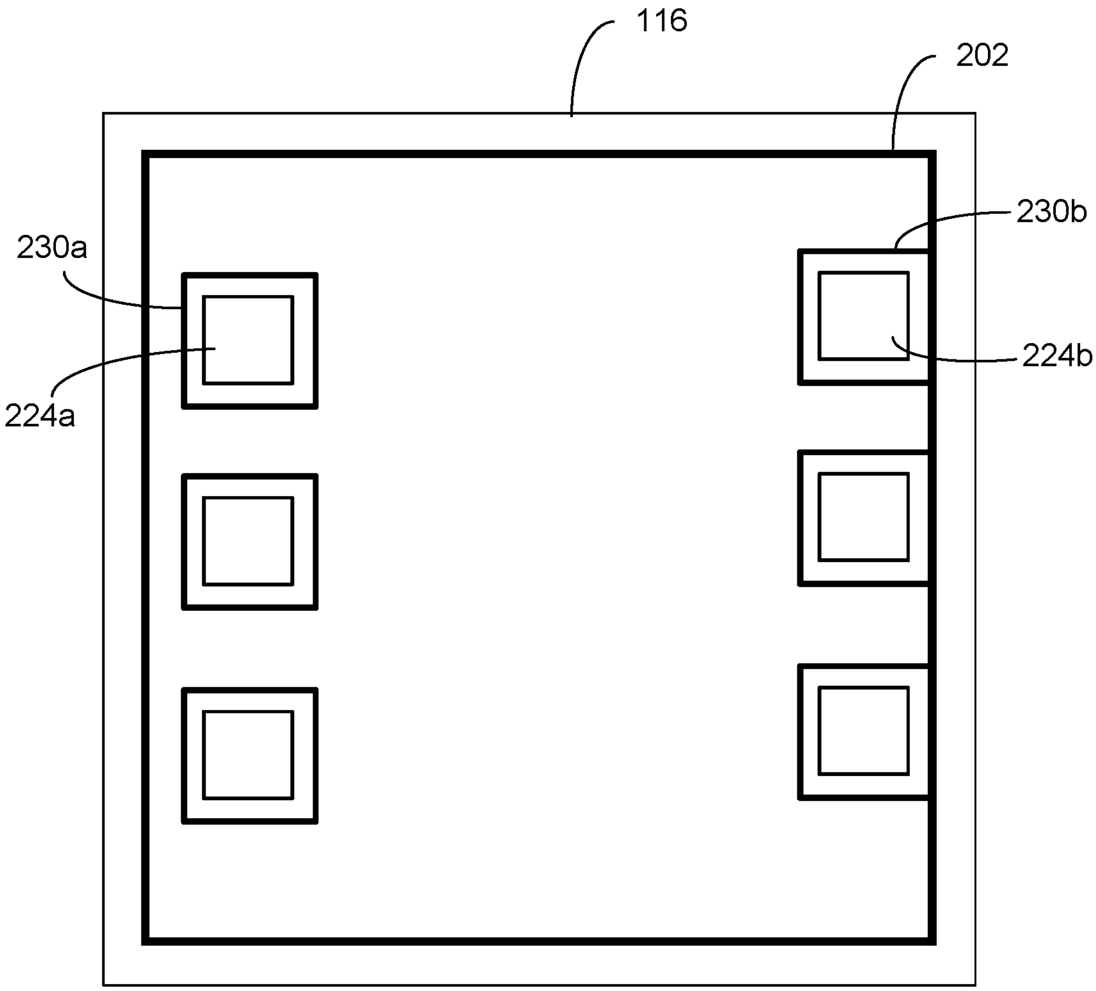
FIG. 2 is a top view of an example implementation of the chip stack of FIG. 1.

FIG. 2 is a top view of an example implementation of the chip stack of FIG. 1. In the example of FIG. 2, an edge ring 202 has a rectangular or square shape that extends around an outer perimeter of the second wafer 116, and around a plurality of bond pads that includes bond pads 224*a* and 224*b*.

A seal ring 230*a*, providing an example implementation of the seal ring 130 of FIG. 1, is positioned around the bond pad 224*a*, and is also rectangular or square in shape. In another example, the bond pad 224*b* is partially surrounded by a seal ring 230*b*, with an adjacent portion of the edge ring 202 connected to the seal ring 230*b* to completely surround the bond pad 224*b*.

It will be appreciated that FIGS. 1 and 2 are highly simplified examples intended for illustration and explanation of the preceding aspects described with respect to the chip stack 100. Many aspects, features, and components of the chip stack 100, and variations thereof, are omitted from FIG. 1 for purposes of clarity and conciseness. Moreover, neither FIG. 1, nor any of FIGS. 2-10, should be understood to be drawn to scale.

Additionally, although the term chip is used herein with reference to singulated elements of a processed wafer, it will be appreciated that each such element may include, and/or may be referred to as, a die or semiconductor die. Thus, for example, the first chip 102 may be referred to as a first die, while the second chip 104 may be referred to as a second die. Other suitable terminology may be used, as well. Additionally, although the simplified chip stack 100 includes only the two chips 102, 104, it will be appreciated that some implementations of the chip stack 100 may include three or more stacked chips.

In the following examples of FIGS. 3 and 4, as well as in the subsequent manufacturing process flows of FIGS. 5-10, a number of common or like elements are included, many of which correspond to, or provide examples of, previously-discussed elements of FIGS. 1 and 2. Such elements are numbered to correspond to the numbering scheme of FIG. 1, for the sake of clarity and consistency.

Figure 3:
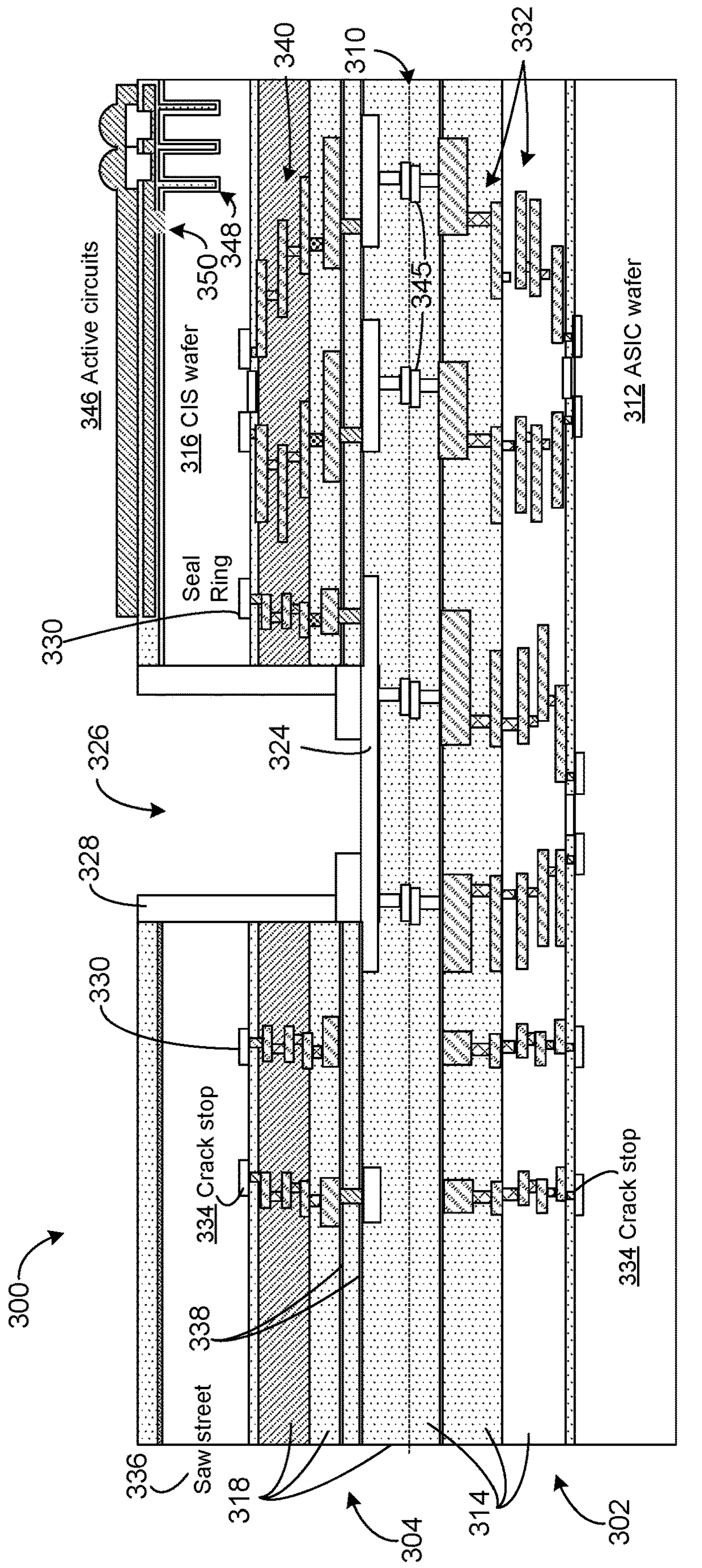
FIG. 3 illustrates a first example implementation of the chip stack of FIG. 1.

For example, in an example chip stack 300 of FIG. 3, an ASIC chip 302 provides an example of the first chip 102 of FIG. 1, and an ASIC wafer 312 and first dielectric layer 314 provide examples of the first wafer 112 and the first dielectric layer 114 of FIG. 1, respectively. As referenced above, and shown in FIG. 3, the first dielectric layer 314 includes a number of different dielectric materials/layers, which are not described here in further detail.

Further in FIG. 3, a contact image sensor (CIS) chip 304 provides an example of the second chip 104 of FIG. 1, and a CIS wafer 316 and second dielectric layer 318 provide examples of the second wafer 116 and the second dielectric layer 118, respectively. As just referenced with respect to the first dielectric layer 314, the second dielectric layer 318 includes a number of different dielectric materials/layers. As referenced above, and described in more detail, below, the second dielectric layer(s) 318 may include one or more SiN layers 338, or other moisture-resistant dielectric material(s).

Consistent with the example of FIG. 1, the chip stack 300 of FIG. 3 includes a bond line 310 at which the first chip 302 and the CIS chip 304 are bonded. A bond pad 324 is positioned above the bond line 310, and is accessible by way of an etched opening 326. The opening 326 is lined with passivation layer 328.

As shown in FIG. 3, the bond pad 324 extends beyond the opening 326 in a direction parallel to the bond line 310. A seal ring 330, corresponding to the seal ring 130 of FIG. 1, is shown in cross-section and extends around the opening 326, as shown in FIG. 2 with respect to the example of the seal ring 230*a*.

As is typical in chip stack devices, the ASIC chip 302 may be connected and configured to control various operations of the CIS chip 304. For example, the ASIC wafer 312 may include various circuits (not shown), and the dielectric layer 314 may include various connecting metal layers 332.

As also illustrated, the dielectric layers 314, 318 may be used to construct desired bonds between the ASIC wafer 312 and the CIS wafer 316, illustrated in FIG. 3 as hybrid bonds 345. Hybrid bonding refers to bonds that combine dielectric bonds with embedded metal to form interconnections. A hybrid bond may also be referred to as a direct bond interconnect (DBI). In the example of FIG. 3, the hybrid bond(s) 345 may be implemented using copper-to-copper connections. Other types of connections, such as solder ball attach or copper pillar connections, may also be used.

As described herein, such copper interconnections may be susceptible to corrosion that occurs as a result of moisture ingress. For example, the chip stack 300 may be encased or packaged using various adhesives and encapsulant materials that may not be hermetic. Particularly when relatively high voltage devices are included, such high voltages may drive moisture diffusion through the encapsulants and through the sidewall passivation layer 328.

In conventional devices, such moisture may then diffuse into the bond line of the chip stack and potentially corrode the Cu/Cu bonds. In FIG. 3, however, even if moisture diffuses through the adhesives and encapsulants of the packaging, and through the sidewall passivation layer 328, the moisture will encounter the bond pad 324, SiN layers 338, and/or the seal ring 330, prior to reaching the bond line 310. As a result, the bond line 310 is protected, and corrosion of the hybrid bonds 345 is avoided.

For purposes of safely and reliably singulating the chip stack 300, a crack stop 334 may be positioned to mitigate cracking that may result from sawing activities at a saw street 336. Meanwhile, various active circuits 346 may be positioned in or on the backside surface of the CIS wafer 316. For example, a color filter array and microlens array may be included. The active circuits 346 may include or utilize a Tungsten shield 350 and various other light shield and/or antireflective materials to facilitate image sensing operations, as well as trench isolation structures 348 for electrical and/or light isolation purposes. Metal layers 340 may be used to connect the active circuits 346 to the hybrid bonds 345, and thus to the ASIC chip 302.

Figure 4:
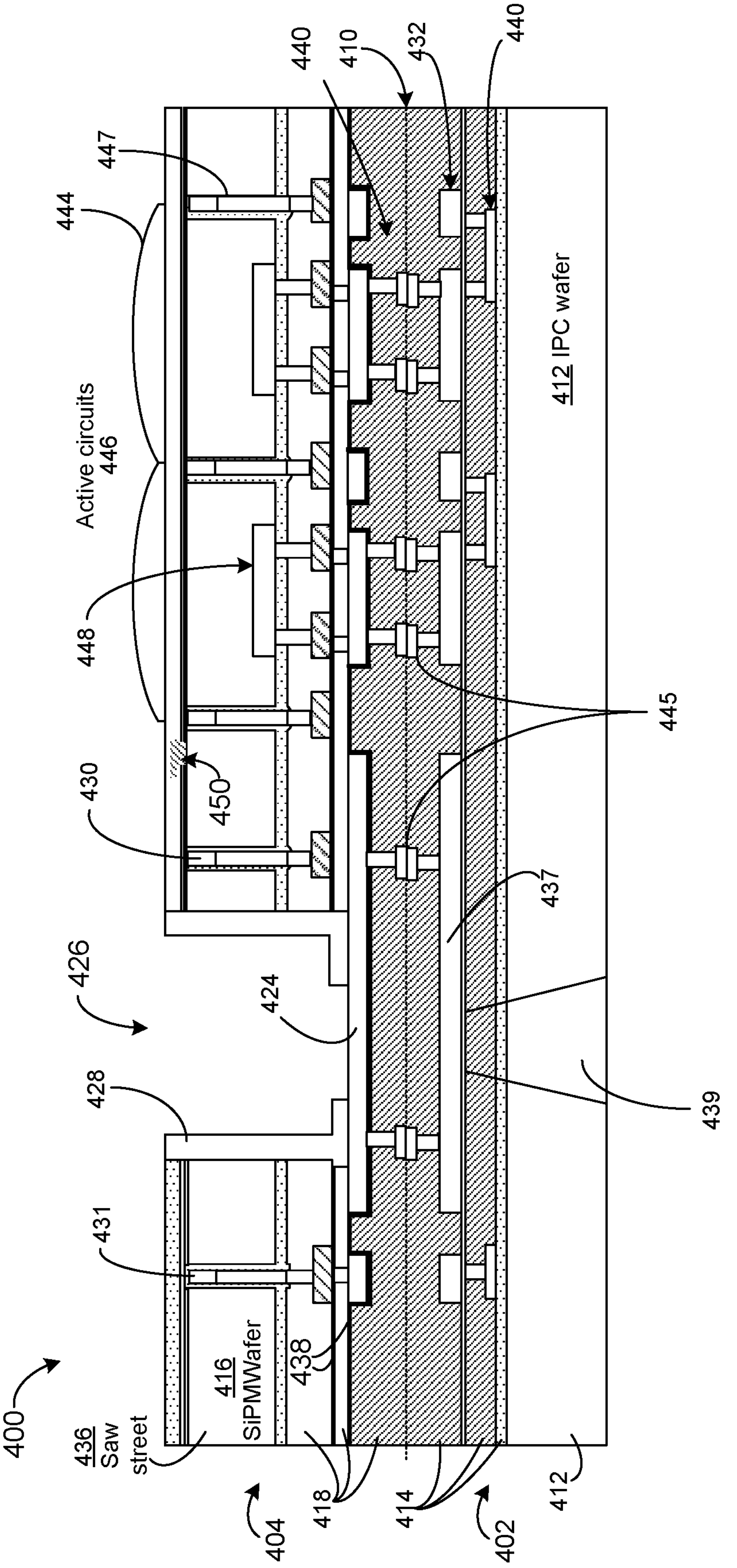
FIG. 4 illustrates a second example implementation of the chip stack of FIG. 1.

FIG. 4 illustrates a second example implementation of the chip stack of FIG. 1. In an example chip stack 400 of FIG. 4, an IPC chip 402 provides an example of the first chip 102 of FIG. 1, and an IPC wafer 412 and first dielectric layer 414 provide examples of the first wafer 112 and the first dielectric layer 114, respectively. As referenced above, the first dielectric layer 414 includes a number of different dielectric materials/layers, which are not described here in further detail.

Further in FIG. 4, Silicon PhotoMultiplier (SiPM) chip 404 provides an example of the second chip 104 of FIG. 1, and a SiPM wafer 416 and second dielectric layer 418 provide examples of the second wafer 116 and the second dielectric layer 118. As just referenced with respect to the first dielectric layer 414, the second dielectric layer 418 includes a number of different dielectric materials/layers. As referenced above with respect to FIG. 3, the second dielectric layer(s) 418 may include one or more SiN layers 438, or other moisture-resistant dielectric material(s).

Consistent with the examples of FIGS. 1 and 3, the chip stack 400 of FIG. 4 includes a bond line 410 at which the first chip 402 and the second chip 404 are bonded. A bond pad 424 is positioned above the bond line 410, and is accessible by way of an etched opening 426. The opening 426 is lined with passivation layer 428.

In FIG. 4, the bond pad 424 extends beyond the opening 426 in a direction parallel to the bond line 410. A seal ring 430, corresponding to the seal ring 130 of FIG. 1, is shown in cross-section and extends around at least a portion of the opening 426, while an edge ring 431 is positioned around another portion of the bond pad 424 and within a saw street 436, as shown in FIG. 2 with respect to the example of the seal ring 230*b* and the edge ring 202.

The IPC chip 402 may be connected and configured to control various operations of the SiPM chip 404. For example, the IPC wafer 412 may include various circuits (not shown), and the dielectric layer 414 may include various connecting metal layers 432, as well as passive circuit elements 440 (e.g., polysilicon resistors, or capacitors).

As also illustrated in FIG. 4, the dielectric layers 414, 418 may be used to construct desired bonds between the IPC wafer 412 and the SiPM wafer 416, illustrated in FIG. 4 as hybrid bonds 445. As in FIG. 3, even if moisture diffuses through adhesives and encapsulants of the packaging of the chip stack 400, and through the sidewall passivation layer 428, the moisture will encounter the bond pad 424, SiN layers 438, the edge ring 431, and/or the seal ring 430, prior to reaching the bond line 410. As a result, the bond line 410 is protected, and corrosion of the hybrid bonds 445 is avoided.

Various active circuits 446 may be positioned in or on the backside surface of the SiPM wafer 416. For example, lenses 444 and isolation trenches 447 may be included to define microcells similar to a pixel for imaging purposes, each of which include an avalanche diode 448. Similar to FIG. 3, the active circuits 446 may include or utilize a Tungsten shield 450 and various other light shield and/or antireflective materials to facilitate sensing operations. Metal layers 432 may be used to connect the active circuits 446 to the hybrid bonds 445, and thus to the IPC chip 402.

Advantageously in FIG. 4, a second bond pad 437 may be included to enable a through-Si via (TSV) connection in an area 439. In this way, for example, chip-scale packaging (CSP) may be enabled.

As described above with respect to the examples of FIGS. 1-4, the various bond pads 124, 224*a*, 224*b*, 324, 424 may be formed at larger sizes than conventional bond pads, thereby facilitating electrical connections thereto, resisting cracking or other deformations, and otherwise improving a reliability of the chip stacks 100, 300, 400. For example, a bond pad thickness of 1 micron or more may be provided. Bond pad dimensions of at least 130 microns in length and 85 microns in width may be provided, and may extend up to 150 microns in length and 90 microns in width, or more.

The various bond pads 124, 224*a*, 224*b*, 324, 424 may be formed entirely below a level of a corresponding second wafer 116, 316, 416. In any implementation, only a portion of an upper surface of a bond pad may be exposed for electrical connection thereto, while an entirety of the bond pad may be positioned below a corresponding second wafer 116, 316, 416 in a direction of a corresponding first chip 102, 302, 402.

Figure 5:
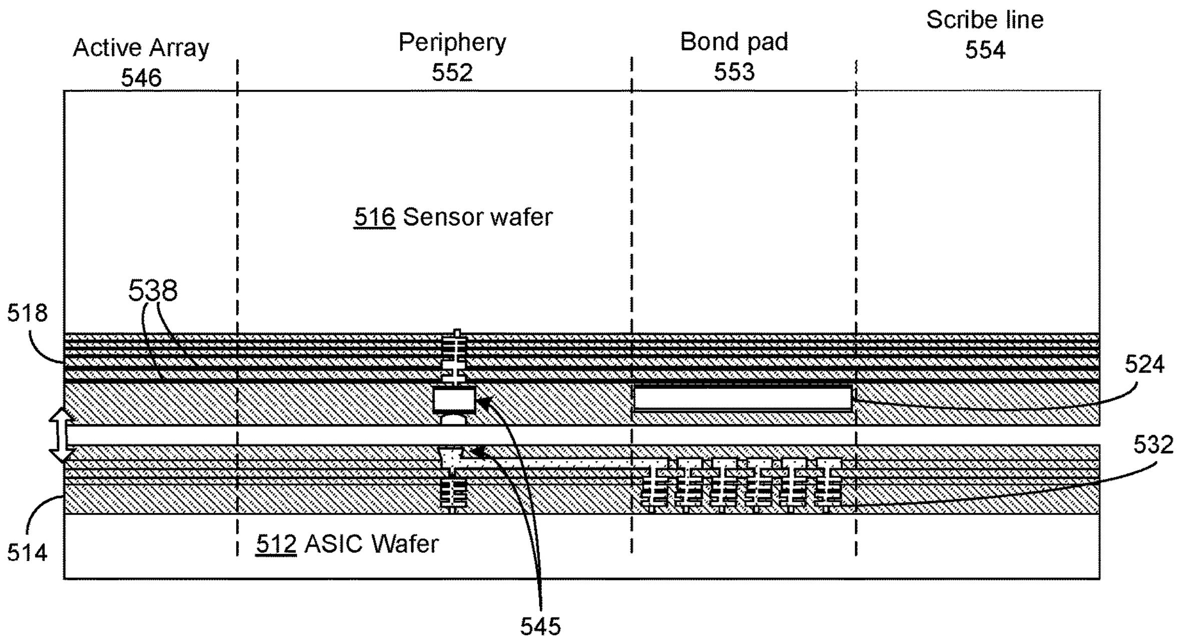
FIG. 5 illustrates a first example operation for manufacturing the chip stack of FIG. 1.

FIGS. 5-9 illustrate example operations for manufacturing an implementation of the chip stack 100 of FIG. 1. In FIG. 5, an ASIC wafer 512 has first dielectric layers 514 formed thereon, with metal layers 532 formed therein. A sensor wafer 516 has second dielectric layers 518 formed thereon, including SiN layers 538. A bond pad 524 is formed in a layer of the second dielectric layers 518. For example, the bond pad 524 may be formed in an upper layer of the second dielectric layers 518, where an upper layer may be, for example, between the uppermost and bottommost layers of the second dielectric layers 518.

As illustrated in FIG. 5, the sensor wafer 516 and second dielectric layers 518 are flipped for mounting onto the first dielectric layers 514, such that the second dielectric layers 518 are between the first dielectric layers 514 and the sensor wafer 516. Accordingly, interconnects 545 may be joined, such as by forming hybrid bonds 645 in FIG. 6, thereby defining a bond line 610 between the first and second dielectric layers.

Figure 6:
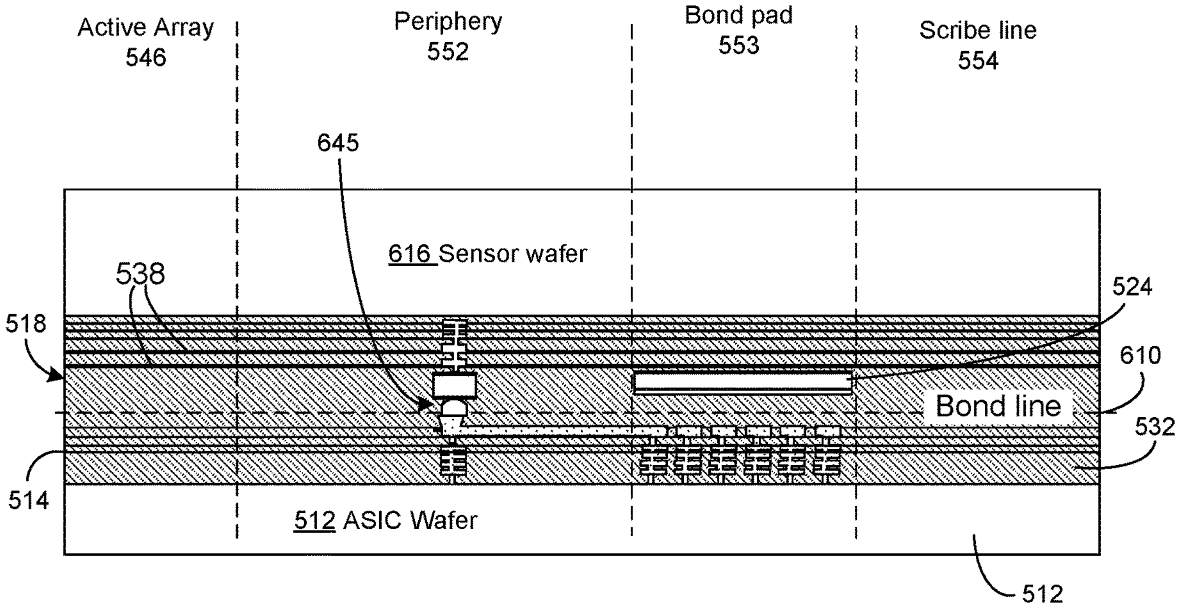
FIG. 6 illustrates a second example operation for manufacturing the chip stack of FIG. 1.

The sensor wafer 516 in FIG. 5 may then be thinned, e.g., to a range of 3-6 microns, to obtain sensor wafer 616 in FIG. 6. For example, various known thinning techniques may be used, such as coarse grinding, fine grinding, wet etching, and/or combinations thereof. The ASIC wafer 512 may also be thinned (not shown separately in the simplified process flow of FIGS. 5-9).

FIGS. 5 and 6 further illustrate that multiple chip areas may be defined for use in subsequent processing as described below with respect to FIGS. 7-10. That is, as shown in FIGS. 5 and 6, such areas may include an active array area 546, a periphery 552, a bond pad area 553, and a scribe line area 554 for sawing/singulating.

Figure 7:
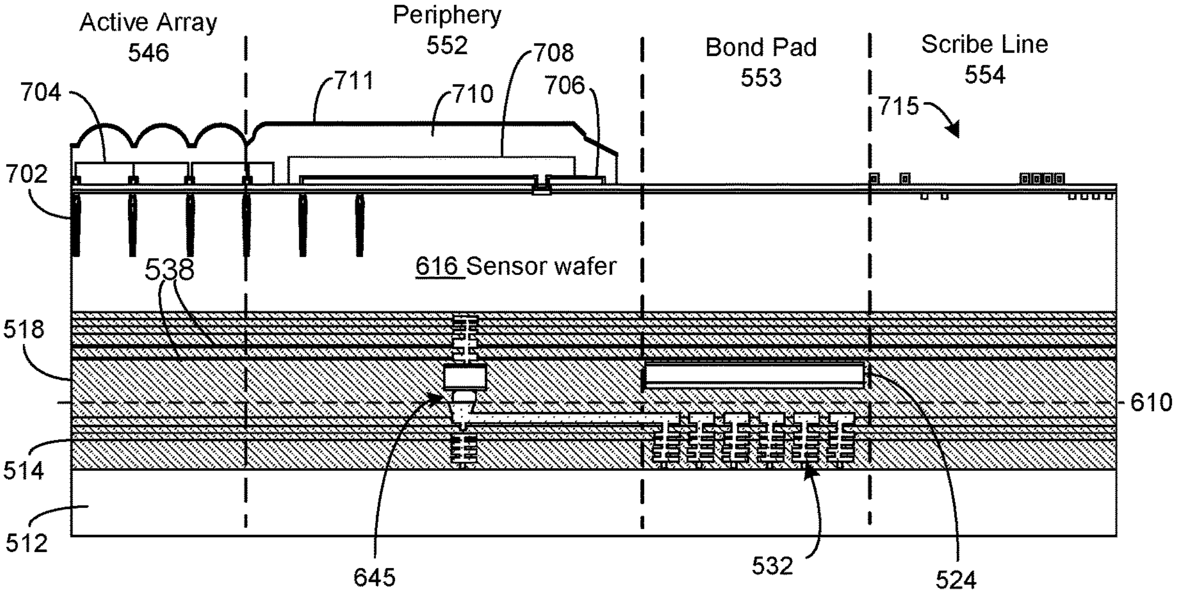
FIG. 7 illustrates a third example operation for manufacturing the chip stack of FIG. 1.

In FIG. 7, the active array area 546, the periphery 552, and the scribe line area 554 may be further processed. For example, deep trench isolation (DTI) structures 702 may be formed in the sensor wafer 616. A color filter array (CFA) 704 and a black light block 708 may be formed over Tungsten elements 706 provided to form an in-pixel grid, light shield, and ground (GND) connection, all covered by lenses 710 and an antireflective coating (ARC) 711. Scribe line area 554 may include various registration boxes/alignment marks 715 that may be used during singulation processes to ensure accurate and reliable singulation.

Figure 8:
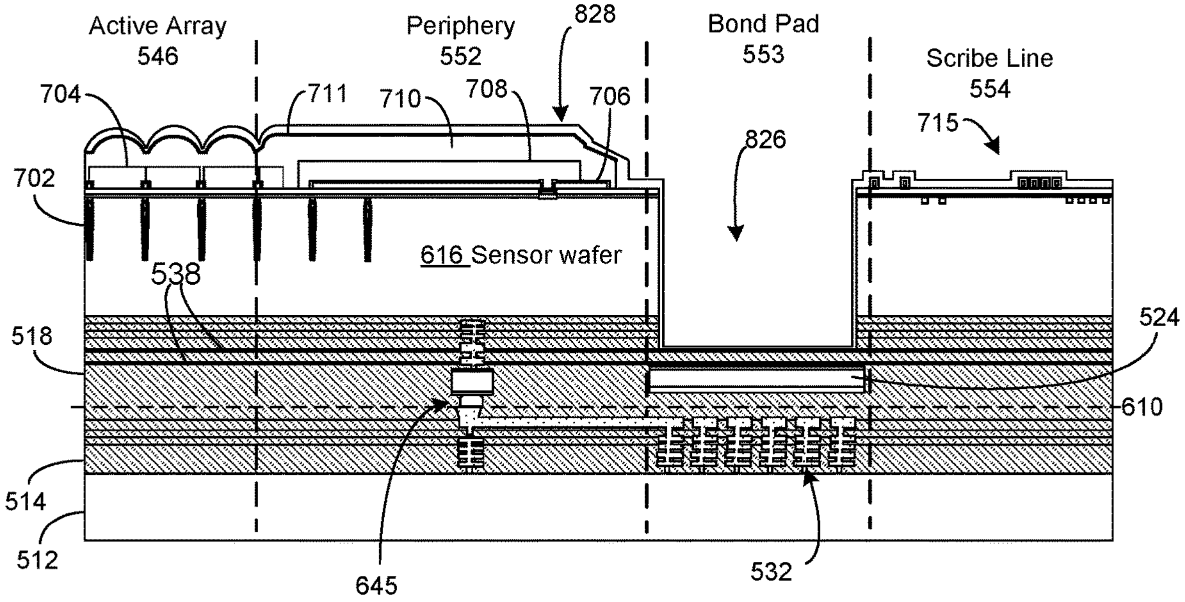
FIG. 8 illustrates a fourth example operation for manufacturing the chip stack of FIG. 1.
Figure 9:
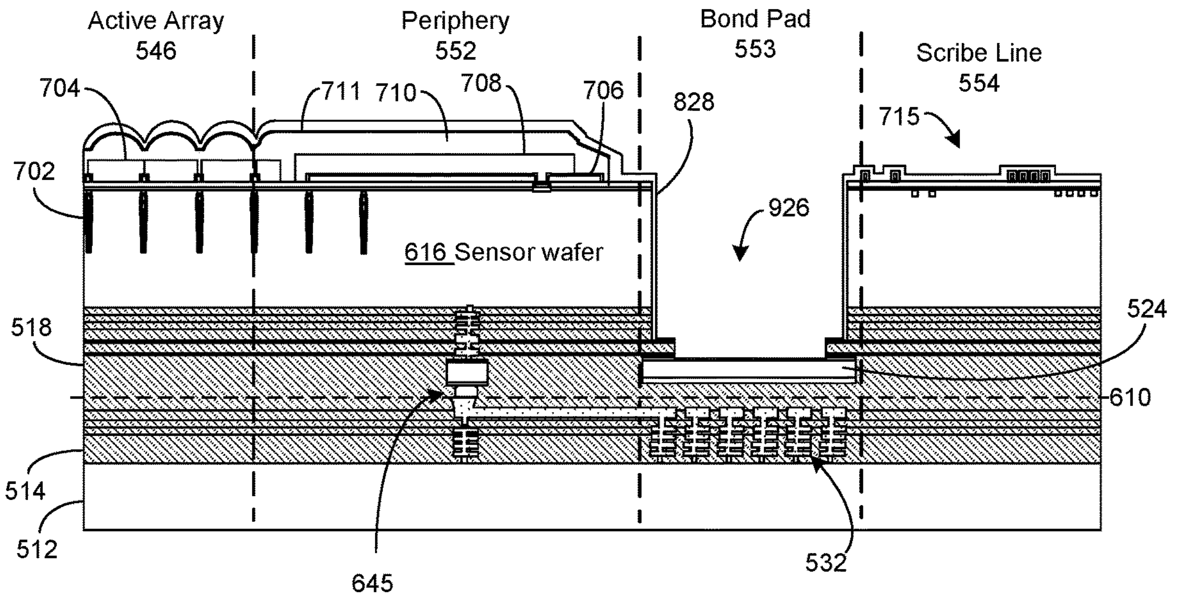
FIG. 9 illustrates a fifth example operation for manufacturing the chip stack of FIG. 1.

In FIG. 8, an opening 826 is etched in the bond pad area 553, and passivation layer 828 is deposited over all areas. The opening 826 may not reach the bond pad 524. In FIG. 9, additional etching is performed to expose the bond pad 524 and define an opening 926.

As described above, etching the opening 926 is easier and more reliable than in conventional devices. For example, etching is only required to occur with respect to the sensor wafer 616 and a portion of the second dielectric layer(s) 518, because the bond pad 524 is positioned above the bond line 610 and within the second dielectric layer(s) 518 (as compared to being positioned below the bond line 610 and within the first dielectric layer(s) 514, in conventional devices). Consequently, in addition to the moisture protection described above, less photoresist is required for etching. Moreover, the etching process has a greater margin for error, and is less likely to inadvertently etch or otherwise damage any of the circuit elements within the active array 546 or the periphery 552.

Figure 10:
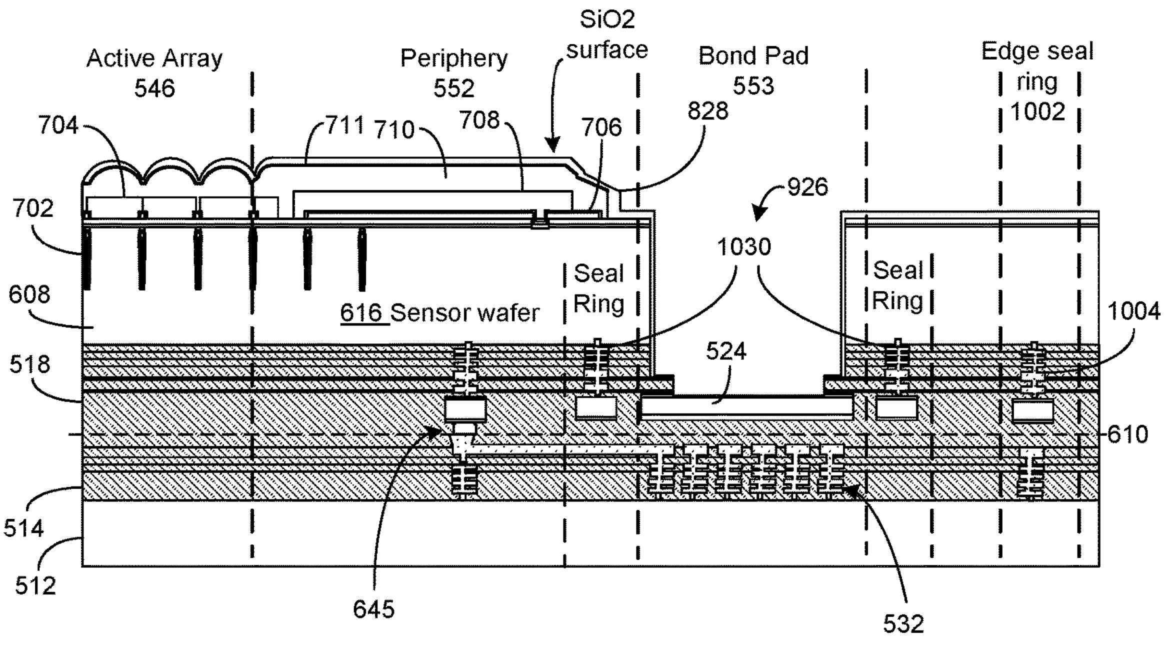
FIG. 10 illustrates an alternative example operation for manufacturing the chip stack of FIG. 1.

FIG. 10 illustrates an alternate implementation of FIG. 9. In FIG. 10, a seal ring 1030 is included, which provides additional moisture protection to guard against corrosion of the hybrid bonds 645. The seal ring 1030 may be same or similar to the seal ring 130, 230*a*, 330, or 430 described above. Additionally, an edge seal ring area 1002 of the chip stack includes an edge ring 1004, which may be same or similar to the example edge ring 202 or 431 described above.

Figure 11:
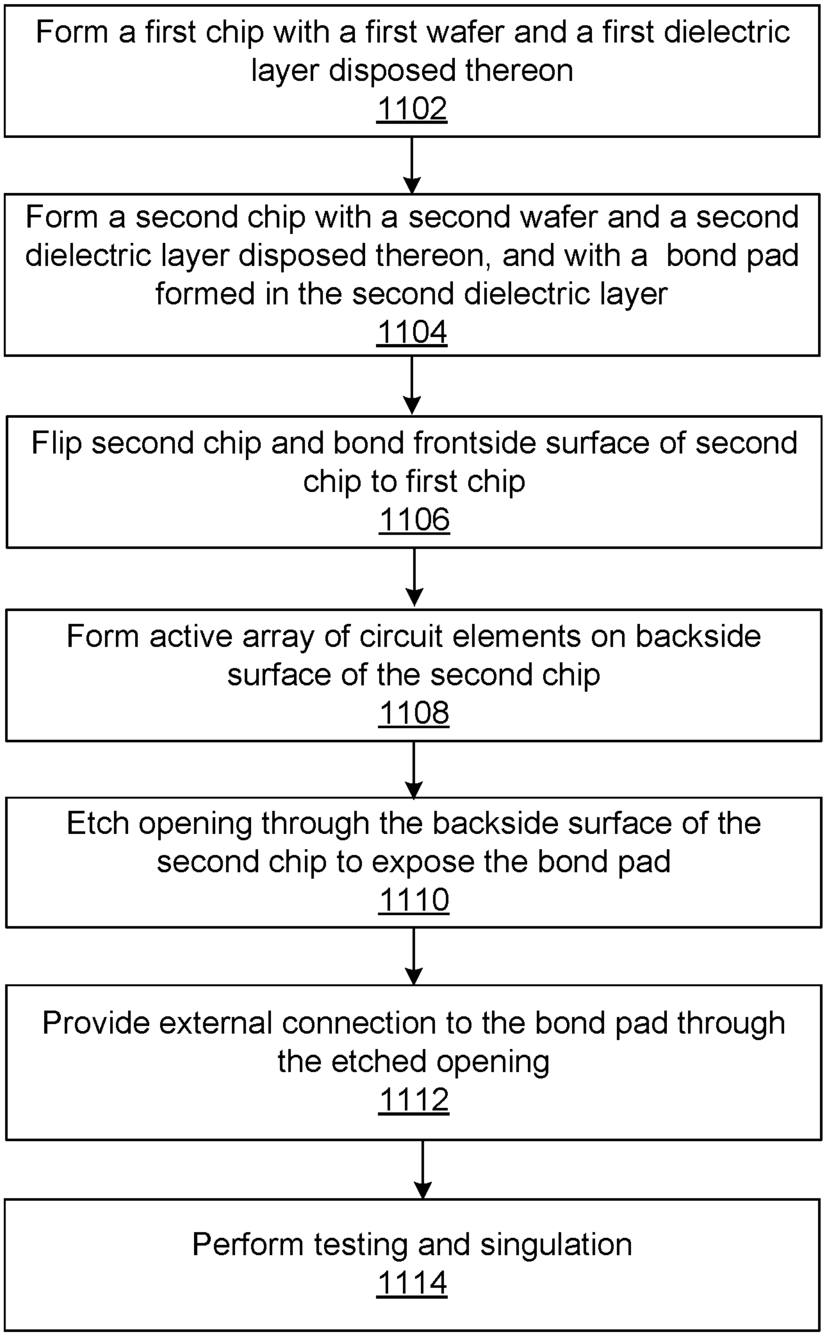
FIG. 11 is a flowchart illustrating example operations for manufacturing the chip stack of FIG. 1.

FIG. 11 is a flowchart illustrating example operations for manufacturing the chip stack of FIG. 1. In the example of FIG. 11, a first chip may be formed with a first wafer and a first dielectric layer disposed thereon (1102). A second chip may be formed with a second wafer and a second dielectric layer disposed thereon, and with a bond pad formed in the second dielectric layer (1104). In some implementations, a moisture-resistant dielectric may be provided within the second dielectric layer and coplanar with the bond pad, and positioned to block a moisture path between the opening and the bond pad.

The second chip may be flipped and a frontside surface of the second chip may be bonded to the first chip to define a bond line (1106). Then, following thinning of the second wafer, an active array of circuit elements may be formed on a backside surface of the second chip (1108).

An opening may be etched through the backside surface of the second chip to expose the bond pad (1110). In some implementations, a dielectric passivation layer may be provided over the active array of circuit elements and in the opening, and then additional etching may be provided to expose the bond pad. In other implementations, a sidewall passivation layer may be provided in the opening following exposure of the bond pad.

An external connection to the bond pad may be provided through the etched opening (1112), such as a wirebond connection. Testing and singulation may be performed (1114).

It will be appreciated that the simplified example of FIG. 11 illustrates an example sequence of manufacturing operations, but that the various operations may occur in a different order than that shown and/or may have more or fewer operations than that shown. For example, depending on available testing and packaging options or preferences, singulation may occur prior to some or all testing operations.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A semiconductor device, comprising:

a first chip that includes a first wafer and a first dielectric layer disposed thereon;

a second chip that includes a second wafer and a second dielectric layer disposed thereon, the second chip having a backside surface and a frontside surface opposed to the backside surface, the second chip being bonded to the first chip at the frontside surface to define a bond line between the first dielectric layer and the second dielectric layer;

an opening through the backside surface of the second chip that extends into the second dielectric layer;

a bond pad disposed within the second dielectric layer between the second wafer and the bond line, and extending beyond the opening in a direction parallel to the bond line; and a moisture-resistant dielectric within the second dielectric layer and coplanar with the bond pad, and blocking a moisture path between the opening and the bond pad.

2. The semiconductor device of claim 1, further comprising:

an external connection to the semiconductor device that is electrically connected to the bond pad through the opening.

3. The semiconductor device of claim 1, wherein an entirety of the bond pad is positioned below the second wafer in a direction of the first chip.

4. The semiconductor device of claim 1, further comprising:

a moisture-resistant seal ring at least partially surrounding the opening.

5. The semiconductor device of claim 4, wherein the bond pad extends beyond the moisture-resistant seal ring in the direction parallel to the bond line.

6. The semiconductor device of claim 1, further comprising:

a copper-copper hybrid bond bonding the second chip to the first chip and defining the bond line.

7. The semiconductor device of claim 1, wherein a thickness of the bond pad is at least 1 micron.

8. The semiconductor device of claim 1, wherein the second chip includes an optical sensor chip and the first chip includes a circuit chip configured to operate and/or receive an output of the optical sensor chip.

9. The semiconductor device of claim 1, further comprising:

a color filter array (CFA) and microlens array disposed on the backside surface of the second chip.

10. A semiconductor device, comprising:

a first chip that includes a first wafer and a first dielectric layer disposed thereon;

a second chip that includes a second wafer and a second dielectric layer disposed thereon, with a bond pad disposed within the second dielectric layer, the second chip having a backside surface and a frontside surface opposed to the backside surface and being bonded to the first chip at the frontside surface to define a bond line between the first dielectric layer and the second dielectric layer;

an opening through the backside surface of the second chip and through the second wafer, the opening extending into the second dielectric layer to expose only a portion of an upper surface of the bond pad for electrical connection thereto; and a moisture-resistant dielectric within the second dielectric layer and coplanar with the bond pad, and blocking a moisture path between the opening and the bond pad.

11. The semiconductor device of claim 10, wherein an entirety of the bond pad is positioned below the second wafer in a direction of the first chip.

12. The semiconductor device of claim 10, further comprising:

a moisture-resistant seal ring at least partially surrounding the opening.

13. The semiconductor device of claim 12, wherein the bond pad extends beyond the moisture-resistant seal ring in a direction parallel to the bond line.

14. A semiconductor device, comprising:

a first chip that includes a first wafer and a first dielectric layer disposed thereon;

a second chip that includes a second wafer and a second dielectric layer disposed thereon, the second chip having a backside surface and a frontside surface opposed to the backside surface and being bonded to the first chip at the frontside surface to define a bond line between the first dielectric layer and the second dielectric layer;

a bond pad disposed within the second dielectric layer between the bond line and the second wafer;

an opening through the backside surface of the second chip and through the second wafer, the opening extending into the second dielectric layer to expose a portion of an upper surface of the bond pad;

an external connection to the semiconductor device that is electrically connected to the bond pad through the opening; and a moisture-resistant dielectric within the second dielectric layer and coplanar with the bond pad, and blocking a moisture path between the opening and the bond pad.

15. The semiconductor device of claim 14, wherein an entirety of the bond pad is positioned below the second wafer in a direction of the first chip.

16. The semiconductor device of claim 14, further comprising: a moisture-resistant seal ring at least partially surrounding the opening.

17. The semiconductor device of claim 16, wherein the bond pad extends beyond the moisture-resistant seal ring in a direction parallel to the bond line.

* * * * *